(12) United States Patent
Sun et al.

(10) Patent No.: US 9,433,127 B2
(45) Date of Patent: Aug. 30, 2016

(54) FAN OPERATION CONTROL SYSTEM

(71) Applicant: ASIA VITAL COMPONENTS CO., LTD., New Taipei (TW)

(72) Inventors: Sung-Hsien Sun, New Taipei (TW); Yu-An Lin, New Taipei (TW); Wei-Tsai Huang, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 546 days.

(21) Appl. No.: 13/936,205

(22) Filed: Jul. 7, 2013

(65) Prior Publication Data
US 2015/0012138 A1 Jan. 8, 2015

(51) Int. Cl.
*H02K 29/08* (2006.01)
*H05K 7/20* (2006.01)
*G06F 1/20* (2006.01)

(52) U.S. Cl.
CPC ............ *H05K 7/20209* (2013.01); *G06F 1/20* (2013.01)

(58) Field of Classification Search
CPC ............... Y02T 10/26; B60L 2240/34; B60L 11/1874; B60L 2240/662; B60L 2240/549; B60L 2240/425; B60L 2240/429; H02K 9/06; H02K 21/24; H02K 3/28; H02K 29/08; H02K 5/225; H02K 11/0021; H02K 23/66; H02K 29/14; H02K 3/02; H02K 1/22; H01F 27/08
See application file for complete search history.

(56) References Cited

U.S. PATENT DOCUMENTS

| | | | | |
|---|---|---|---|---|
| 5,675,464 A * | 10/1997 | Makaran | ................ | H02H 7/093 361/115 |
| 6,891,302 B1 * | 5/2005 | Gabrys | ................ | F16C 39/063 310/178 |
| 8,698,432 B2 * | 4/2014 | Kern | ..................... | H02P 6/182 318/400.01 |
| 2003/0141854 A1 * | 7/2003 | Kuribayashi | ........... | F02N 11/04 322/28 |
| 2005/0046375 A1 * | 3/2005 | Maslov | ..................... | B60L 8/00 318/650 |
| 2011/0266868 A1 * | 11/2011 | Yamamoto | ................ | B60L 3/06 307/24 |
| 2014/0369813 A1 * | 12/2014 | Muramatsu | ........... | F04D 27/008 415/118 |
| 2015/0012138 A1 * | 1/2015 | Sun | ........................ | G06F 1/20 700/275 |
| 2015/0159663 A1 * | 6/2015 | Chen | ..................... | F04D 27/004 318/816 |

* cited by examiner

Primary Examiner — Marlon Fletcher

(57) ABSTRACT

A fan operating control system includes a magnetic sensor unit, a control unit, a rectifier unit and a coil unit. The control unit is electrically connected to the magnetic sensor unit and the rectifier unit; the rectifier unit is further electrically connected to a ground; and the coil unit is electrically connected to the control unit and the ground. The control unit detects any fan electric current flowing through the coil unit and generates a rotating speed signal accordingly. When no fan electric current is detected at the coil unit, the control unit stops generating the rotating speed signal. Therefore, it is able to avoid a whole fan system from making an error decision and outputting rotating speed signal continuously when there is not fan electric current flowing through the coil unit, and any abnormal condition that would adversely affect the fan service life can be avoided, too.

5 Claims, 3 Drawing Sheets

FAN OPERATION CONTROL SYSTEM

FIELD OF THE INVENTION

The present invention relates to a fan system, and more particularly to a fan operating control system that helps a fan system avoid an error decision of continuously generating a fan rotating speed signal when there is not electric current flowing through the fan.

BACKGROUND OF THE INVENTION

Following the rapid development in the electronic industrial fields in recent years, various electronic elements have largely upgraded performance to provide higher and higher operating and data processing speed. With the constantly increased operating speed of the chipset and the constantly increased number of chips inside the electronic elements, more heat is produced by the chips or the chipset during the operating thereof. The heat must be timely dissipated from the electronic elements to avoid largely lowered performance and reduced operating/data processing speed of the electronic elements. Heat undesirably accumulated in the electronic elements would even cause burnout of the electronic elements. Therefore, heat dissipation has already become one of the most important issues for electronic elements. Presently, cooling fans are the most common means for heat dissipation.

Cooling fans are widely adopted for use with, for example, computers, electronic communication apparatus, and server appliances. Generally, several fans are parallelly or serially connected to one another when they are mounted in the electronic communication apparatus or the server appliances, in order to obtain effectively upgraded heat dissipation efficiency. Moreover, Hall elements are usually used in cooling fans to output signals indicating fan rotating speed. When any one of the cooling fans is disordered and does not operate, air flow produced by other good fans may still bring the blade assembly of the disordered fan to rotate.

Under this situation, the Hall element in the disordered fan would still sense a magnetic polarity shift in the fan to thereby output a rotating speed signal or an alert signal as usual. This condition would cause the whole fan system to wrongly determine the actually disordered fan is currently in normal operation and thereby keep outputting the rotating speed signal instead of an alert signal. As a result, a maintenance person is not able to receive the alert signal and reach the site at once to replace the damaged fan with a new one. This also means the electronic apparatus or appliances in the communication chassis or the server cabinet have lost their best heat dissipation effect and tend to become damaged due to an excessively high temperature thereof. Therefore, increased repair and maintenance cost is required for them.

However, there are tremendous communication chassis and server cabinets widely distributed over different locations. Under this situation, in the event of any damaged cooling fan in any of the communication chassis and the server cabinets, it would be difficult for the maintenance person to reach the site at once and replace the damaged fan with a new one. When any of the communication chassis or the service cabinets sounds a warning or becomes out of order due to failed heat dissipation thereof, an overall heat dissipation performance of the chassis or cabinet will be directly seriously affected to shorten the service life of the electronic apparatus or appliances mounted in the chassis or cabinets.

It is therefore tried by the inventor to develop an improved fan operating control system to overcome the drawbacks and problems in the conventional cooling fans.

SUMMARY OF THE INVENTION

A primary object of the present invention is to provide a fan operating control system that helps a fan system avoid an error decision of continuously generating a fan rotating speed signal when there is not electric current flowing through the fan.

Another object of the present invention is to provide a fan operating control system that helps avoid any abnormal condition having an adverse influence on the fan service life.

To achieve the above and other objects, the fan operating control system according to the present invention includes a magnetic sensor unit, a control unit, a rectifier unit and a coil unit. The magnetic sensor unit is able to generate a sensing signal; the control unit is electrically connected to the magnetic sensor unit and receives the sensing signal; the rectifier unit is electrically connected to the control unit and a ground; the coil unit is also electrically connected to the control unit and the ground. The control unit is able to detect any fan electric current flowing through the coil unit and generates a rotating speed signal accordingly. The control unit stops generating the rotating speed signal when there is not fan electric current detected at the coil unit. With these arrangements, it is able to avoid a fan system from making an error decision and outputting rotating speed signal continuously when there is not fan electric current flowing through the coil unit, and any abnormal condition that would adversely affect the fan service life can be avoided, too.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
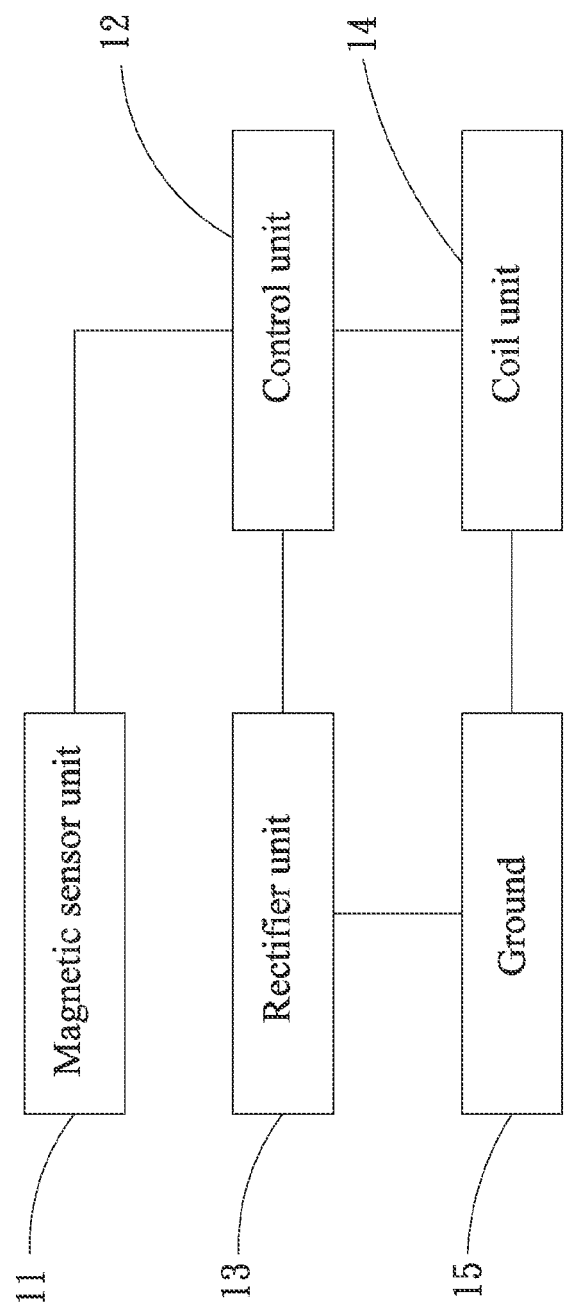
FIG. 1 is a block diagram of a fan operating control system according to a first preferred embodiment of the present invention.

The present invention will now be described with some preferred embodiments thereof and with reference to the accompanying drawings. For the purpose of easy to understand, elements that are the same in the preferred embodiments are denoted by the same reference numerals.

Please refer to FIG. 1 that is a block diagram of a fan operating control system 1 according to a first preferred embodiment of the present invention. As shown, in the first preferred embodiment, the fan operating control system 1 includes a magnetic sensor unit 11, a control unit 12, a rectifier unit 13, and a coil unit 14. The magnetic sensor unit 11 is able to generate a sensing signal. In the first preferred embodiment, the sensor unit 11 is a Hall element and is electrically connected to the control unit 12; the control unit 12 is a microcontroller and is further electrically connected to the rectifier unit 13; and the rectifier unit 13 is a bridge rectifier circuit further electrically connected to a ground 15.

Figure 2:
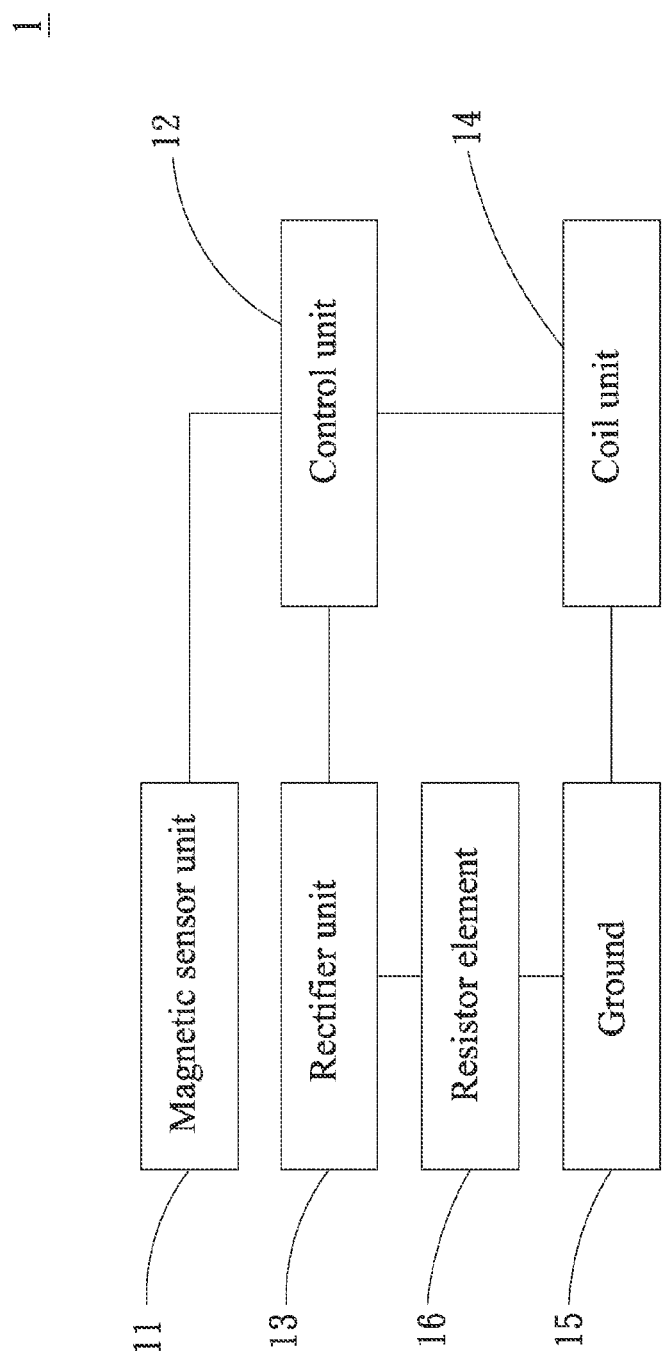
FIG. 2 is a block diagram of a fan operating control system according to a second preferred embodiment of the present invention.

FIG. 2 is a block diagram of a fan operating control system 1 according to a second preferred embodiment of the present invention. As shown, the fan operating control system 1 in the second preferred embodiment is generally structurally similar to the first preferred embodiment, except for a resistor element 16 located between the rectifier unit 13 and the ground 15. The resistor element 16 is electrically connected at an end to the rectifier unit 13 and at another end to the ground 15, allowing the rectifier unit 13 to electrically connect to the ground 15 via the resistor element 16.

The coil unit 14 is electrically connected to both the control unit 12 and the ground 15.

Figure 3:
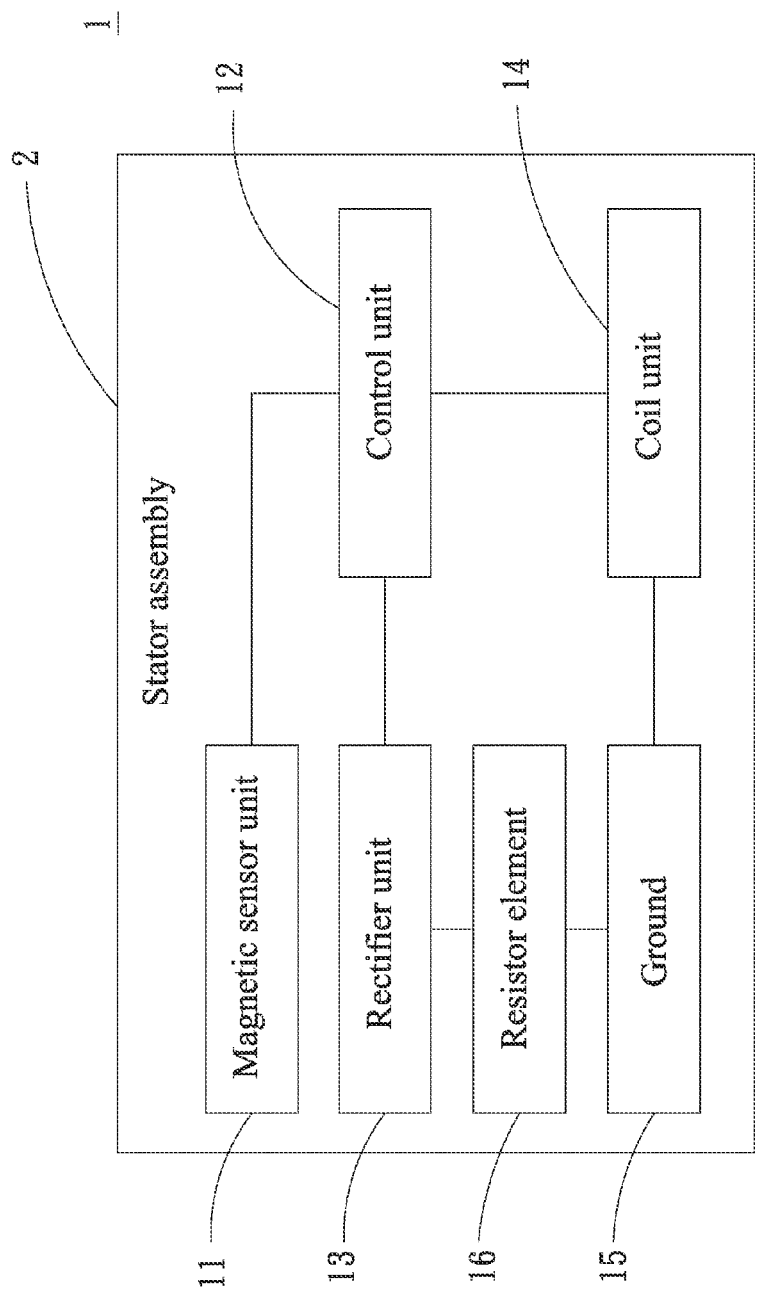
FIG. 3 shows an example of application of the fan operating control system according to the preferred embodiment of the present invention.

FIG. 3 shows an example of application of the fan operating control system 1 according to the preferred embodiment of the present invention in a stator assembly 2 of a fan. When the fan is switched on and is in a normal operating state, a control signal is generated to the control unit 12. That is, the control unit 12 receives not only the control signal, but also the sensing signal that is generated by the magnetic sensor unit 11 when it senses a magnetic polarity shift. After the control unit 12 receives the control signal and the sensing signal, fan electric current is allowed to flow to the rectifier unit 13. Meanwhile, the fan electric current also passes through the coil unit 14 to the ground 15. The control unit 12 is able to detect whether the fan electric current has passed through the coil unit 14 to the ground 15. In the case the control unit 12 detects there is fan electric current passing through the coil unit 14 to the ground 15, the control unit 12 will generate either a rotating speed signal for controlling the fan's operating speed or an alert signal for alerting a user to the fan's operating state.

In the event the fan does not power on normally, air flow produced by other fans serially or parallelly connected thereto may still bring the blade assembly of the fan to rotate, but no fan electric current will pass through the coil unit 14 to the ground 15. Therefore, in the process of detecting fan electric current by the control unit 12, no fan electric current will be detected at the coil unit 14 and the ground 15, and the control unit 12 stops generating the rotating speed signal. In this manner, it is possible to avoid the whole fan system from making an error decision and outputting the rotating speed signal continuously when there is not any fan electric current flowing through the coil unit 14. Accordingly, any abnormal condition that would adversely affect the fan service life can be avoided.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A fan operating control system, comprising a magnetic sensor unit for generating a sensing signal; a control unit electrically connected to the magnetic sensor unit and receiving the sensing signal; a rectifier unit electrically connected to the control unit and a ground; and a coil unit electrically connected to between the control unit and the ground; wherein the control unit detects any fan electric current flowing through the coil unit to the ground and generates a rotating speed signal for controlling the fan's operating speed for an alert signal for alerting a user to the fan's operating state accordingly; and wherein when the control unit detects no fan current flowing through the coil unit to the ground, the control unit stops generating the rotating speed signal to stop the operation of the fan.

2. The fan operating control system as claimed in claim 1, wherein the magnetic sensor unit is a Hall element.

3. The fan operating control system as claimed in claim 1, wherein the rectifier unit is a bridge rectifier circuit.

4. The fan operating control system as claimed in claim 1, further comprising a resistor element having an end electrically connected to the rectifier unit and another end to the ground; whereby the rectifier unit is electrically connected to the ground via the resistor element.

5. The fan operating control system as claimed in claim 1, wherein the control unit is a microcontroller.

* * * * *